(12) United States Patent
Han et al.

(10) Patent No.: US 8,654,474 B2
(45) Date of Patent: Feb. 18, 2014

(54) INITIALIZATION FOR DECODER-BASED FILTER CALIBRATION

(75) Inventors: Yang Han, Sunnyvale, CA (US); Madhusudan Kalluri, Sunnyvale, CA (US); Shaohua Yang, San Jose, CA (US); Weijun Tan, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 61 days.

(21) Appl. No.: 13/525,188

(22) Filed: Jun. 15, 2012

(65) Prior Publication Data
US 2013/0335850 A1 Dec. 19, 2013

(51) Int. Cl.
*G11B 5/596* (2006.01)
*G11B 7/00* (2006.01)

(52) U.S. Cl.
USPC .......................... 360/65; 369/59.22

(58) Field of Classification Search
USPC ................. 360/53, 65, 31, 39, 40; 369/53.41, 369/53.42, 53.35, 59.22; 381/94.7, 94.8
See application file for complete search history.

(56) References Cited

U.S. PATENT DOCUMENTS

| | | | |
|---|---|---|---|
| 6,185,175 B1 * | 2/2001 | Zook | 369/53.35 |
| 6,535,553 B1 | 3/2003 | Limberg et al. | |
| 7,248,630 B2 | 7/2007 | Modrie et al. | |
| 7,257,764 B2 | 8/2007 | Suzuki et al. | |
| 7,421,017 B2 | 9/2008 | Takatsu | |
| 7,502,189 B2 | 3/2009 | Sawaguchi | |
| 7,715,471 B2 | 5/2010 | Werner | |
| 8,018,360 B2 | 9/2011 | Nayak | |
| 8,046,666 B2 | 10/2011 | Park et al. | |
| 8,149,527 B2 * | 4/2012 | Tan et al. | 360/25 |
| 8,208,213 B2 | 6/2012 | Liu | |
| 2006/0123285 A1 | 6/2006 | De Araujo et al. | |
| 2009/0002862 A1 | 1/2009 | Park et al. | |
| 2011/0072335 A1 | 3/2011 | Liu et al. | |
| 2011/0075569 A1 | 3/2011 | Marrow | |
| 2011/0164332 A1 | 7/2011 | Cao | |
| 2011/0167227 A1 | 7/2011 | Yang et al. | |
| 2012/0019946 A1 | 1/2012 | Aravind | |
| 2012/0056612 A1 | 3/2012 | Mathew | |
| 2012/0069891 A1 | 3/2012 | Zhang | |
| 2012/0124119 A1 | 5/2012 | Yang | |
| 2012/0236430 A1 | 9/2012 | Tan | |

OTHER PUBLICATIONS

U.S. Appl. No. 13/346,556, Unpublished (filed Jan. 9, 2012) (Haitao Xia).
U.S. Appl. No. 13/491,062, Unpublished (filed Jun. 7, 2012) (Jin Lu).
U.S. Appl. No. 13/239,719, Unpublished (filed Sep. 22, 2011) (Haitao Xia).
U.S. Appl. No. 13/272,209, Unpublished (filed Oct. 12, 2011) (Yu Liao).

* cited by examiner

*Primary Examiner* — Nabil Hindi
(74) *Attorney, Agent, or Firm* — Hamilton DeSanctis & Cha

(57) ABSTRACT

Various embodiments of the present inventions are related to initialization of decoder-based filter calibration, and in particular to initially using either a detector output or unconverged data from the decoder to train filter coefficients in a noise predictive calibration engine until data sectors converge in the decoder and can be used to train filter coefficients.

21 Claims, 3 Drawing Sheets

INITIALIZATION FOR DECODER-BASED FILTER CALIBRATION

BACKGROUND

Various data processing systems have been developed for use in applications such as storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of data processors have been developed to detect and correct errors in digital data. For example, data detectors and decoders such as Maximum a Posteriori (MAP) detectors and Low Density Parity Check (LDPC) decoder may be used to detect and decode the values of data bits or multi-bit symbols retrieved from storage or transmission systems.

Sectors of data from storage systems or other blocks of data may vary in the signal to noise ratio (SNR) and thus in the difficulty of recovering the original data after storage or transmission. Data detectors such as Soft Output Viterbi Algorithm (SOVA) detectors may include Noise Predictive Finite Impulse Response (NPFIR) filters to improve data detection of noisy data sectors. An example NPFIR filter that may be embedded in a detector trellis is disclosed in FIG. 1. The NPFIR filter applies a mathematical operation to a digital data stream to achieve any of a wide range of desired frequency responses. The NPFIR is noise predictive because the filter or tap coefficients are tuned based on the expected noise.

As illustrated in FIG. 1, the NPFIR filter 100 passes an input 102 through a series of delay elements 104, 106 and 110, multiplying the delayed signals by filter coefficients or tap weights 112, 114, 116 and 120, and summing the results to yield a filtered output 122. The outputs 130, 140 and 150 of each delay element 104, 106 and 110 and the input 102 form a tapped delay line and are referred to as taps. The number of delay elements 104, 106 and 110, and thus the number of taps 102, 130, 140 and 150 (also referred to as the order or length of the NPFIR filter 100) may be increased to more finely tune the frequency response, but at the cost of increasing complexity. The NPFIR filter 100 implements a filtering equation such as $Y[n]=F_0X[n]+F_1X[n-1]+F_2X[n-2]+F_3X[n-3]$ for the three-delay filter illustrated in FIG. 1, or more generally $Y[n]=F_0X[n]+F_1X[n-1]+F_2X[n-2]++F_3X[n-L]$, where $X[n]$ is the current input 102, the value subtracted from n represents the index or delay applied to each term, $F_i$ are the tap weights 112, 114, 116 and 120, $Y[n]$ is the output 122 and L is the filter order. The input 102 is multiplied by tap weight 112 in a multiplier 124, yielding a first output term 126. The second tap 130 is multiplied by tap weight 114 in multiplier 132, yielding a second output term 134, which is combined with first output term 126 in an adder 136 to yield a first sum 148. The third tap 140 is multiplied by tap weight 116 in multiplier 142, yielding a third output term 144, which is combined with first sum 148 in adder 146 to yield a second sum 158. The fourth tap 150 is multiplied by tap weight 120 in multiplier 152, yielding a fourth output term 154, which is combined with second sum 158 in adder 156 to yield output 122. By changing the tap weights 25 112, 114, 116 and 120, the filtering applied to the input 102 by the NPFIR filter 100 is adjusted to select the desired pass frequencies and stop frequencies.

Multiple NPFIR filters may be embedded in a trellis-based SOVA data detector, with different NPFIR filters being selected based on the path taken through the trellis. The filter coefficients of such NPFIR filters may be tuned by hard decisions from a downstream data decoder for converged data sectors. However, when tuning the filter coefficients based on converged data sectors, the system may be trapped in a state with unsuitable initial filter coefficients that do not allow data sectors to converge. A need therefore remains for a system to initialize decoder-based filter calibration circuit that allows data sectors to converge so that they can be used to tune filter coefficients.

BRIEF SUMMARY

Various embodiments of the present inventions are related to initialization of decoder-based filter calibration, and in particular to initially using either a detector output or unconverged data from the decoder to train filter coefficients in a noise predictive calibration engine until data sectors converge in the decoder and can be used to train filter coefficients.

In some embodiments, hard decisions from a detector are used along with received Y samples to initially train filter coefficients in a noise predictive calibration engine. Once data sectors begin to converge in a downstream decoder, the hard decisions for the converged data sectors are used to train filter coefficients in the noise predictive calibration engine.

In some other embodiments, hard decisions for data sectors produced at the output of a decoder are used along with received Y samples to train filter coefficients in the noise predictive calibration engine, with hard decisions for data sectors that have not converged being used initially. Once data sectors begin to converge in a downstream decoder, the constraints on the data sectors selected to train filter coefficients are tightened, allowing only hard decisions for converged data sectors to train filter coefficients in the noise predictive calibration engine. In some embodiments, a scheduler is used to select data sectors for training, both during the initial stage in which unconverged data sectors are used for training and in the second stage in which only converged data sectors are used. The scheduler selects the best available data sectors for training, removing data sectors from a FIFO to access better data sectors that were added later.

This summary provides only a general outline of some embodiments according to the present inventions. Many other objects, features, advantages and other embodiments of the present inventions will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Figure 3:
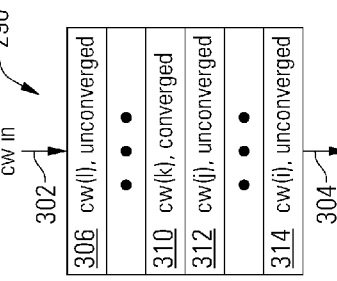
FIG. 3 depicts a FIFO with data sectors to be used for filter calibration in accordance with some embodiments of the present inventions.
Figure 1:
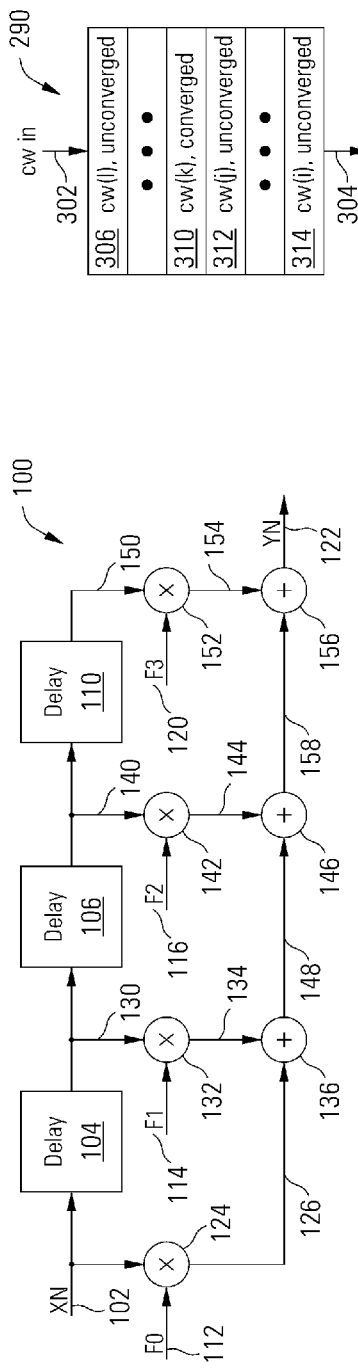
FIG. 1 depicts a prior art finite impulse response filter that may be embedded in a data detector as a noise predictive filter.

Various embodiments of the present inventions are related to initialization of decoder-based filter calibration, and in particular to initially using either a detector output or unconverged data from the decoder to train filter coefficients in a noise predictive calibration engine (NPCAL) until data sectors converge in the decoder and can be used to train filter coefficients. A trellis-based data detector using embedded noise predictive finite impulse response filters (NPFIRs) detects values of input data sectors. A downstream decoder performs an iterative decoding operation and parity checks on the output of the data detector, yielding hard decisions for the data sectors and an indication of whether the data sectors converged. The NPCAL adapts the tap coefficients of the NPFIRs in the data detector based on the input Y samples for the input data sectors and on the hard decisions for the converged data sectors from the decoder. However, the initial tap coefficients for the NPFIRs in the data detector may not allow the data sectors to converge in the decoder, trapping the system in an unusable state because the decoder-based filter calibration receives no converged data sectors for training.

Several embodiments of decoder-based filter calibration initialization are disclosed herein which prevent this trapped condition.

In some embodiments, hard decisions from the detector are used along with received Y samples to initially train filter coefficients in the NPCAL. The training improves the filter coefficients, which are applied in the detector, allowing the data sectors to converge in the decoder. Once data sectors begin to converge in a downstream decoder, the hard decisions for the converged data sectors are used to train filter coefficients in the noise predictive calibration engine, further improving the filter coefficient training and continuously adapting to changing noise conditions in the channel.

In some other embodiments, hard decisions for data sectors produced at the output of a decoder are used along with received Y samples to train filter coefficients in the noise predictive calibration engine, with hard decisions for data sectors that have not converged being used initially. Because the hard decisions from the decoder for even unconverged data sectors are typically closer to correct values than the hard decisions from the upstream detector, using the hard decisions for unconverged data sectors initially enables the filter coefficient training to improve so that at least some data sectors converge in the decoder. Once data sectors begin to converge in a downstream decoder, the constraints on the data sectors selected to train filter coefficients are tightened, allowing only hard decisions for converged data sectors to train filter coefficients in the noise predictive calibration engine and further improving the filter coefficient training and continuously adapting to changing noise conditions in the channel. In some embodiments, a scheduler is used to select data sectors for training, both during the initial stage in which unconverged data sectors are used for training and in the second stage in which only converged data sectors are used. The scheduler selects the best available data sectors for training, removing data sectors from a FIFO to access better data sectors that were added later.

Both these embodiments jump start the calibration of filter coefficients for the NPFIRs in the data detector so that at least some data sectors converge in the decoder, before switching to decoder-based filter calibration using only decoder hard decisions for converged data sectors. The initial use of detector hard decisions or decoder hard decisions for unconverged data sectors prevents the trapped condition in which no data sectors can converge in the decoder, even if the tap coefficients are not ideal for the noise conditions of the channel. After switching to decoder hard decisions for converged data sectors to calibrate filter coefficients for the NPFIRs, the tap coefficients are further improved because the decoder hard decisions are more likely to be correct.

The filter coefficients for the NPFIRs may be calibrated based on an error signal formed of the difference between the received Y samples and the expected Y samples. The decoder hard decisions for converged data sectors are most likely to be correct and therefore a good source for expected Y samples.

The NPCAL may generate noise predictive filter coefficients in any suitable manner using received values and expected values to form an error signal, for example as disclosed in US Patent Application Publication 2011/0072335 for "Branch-Metric Calibration Using Varying Bandwidth Values", filed Sep. 18, 2009, which is incorporated herein for all purposes. The filter coefficients generated by the NPCAL are data dependent, and a set of filter coefficients contains multiple coefficients, one for each path through the detector trellis at a given time. For example, in a detector trellis with 3-bit states, the data detector may have any of 8 values for a given 3-bit state, and one of eight filter coefficients are selected from the set of filter coefficients based on the 3-bit state. The first state 000 would select the first filter coefficients $f_0$, the second state 001 would select the second filter coefficients $f_1$, and so on up to the eighth state 111 which would select the eight filter coefficients $f_7$.

The decoder-based filter calibration initialization disclosed herein is applicable to processing data stored in or transmitted over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives. For example, the data processing system may be, but is not limited to, a read channel in a magnetic hard disk drive, detecting and decoding data sectors from the drive.

The term "sector" is used herein with respect to several example embodiments, but may be considered to refer generally to a block of data processed in a data processing system with retained sector reprocessing, regardless of the source or format of the data.

Figure 2:
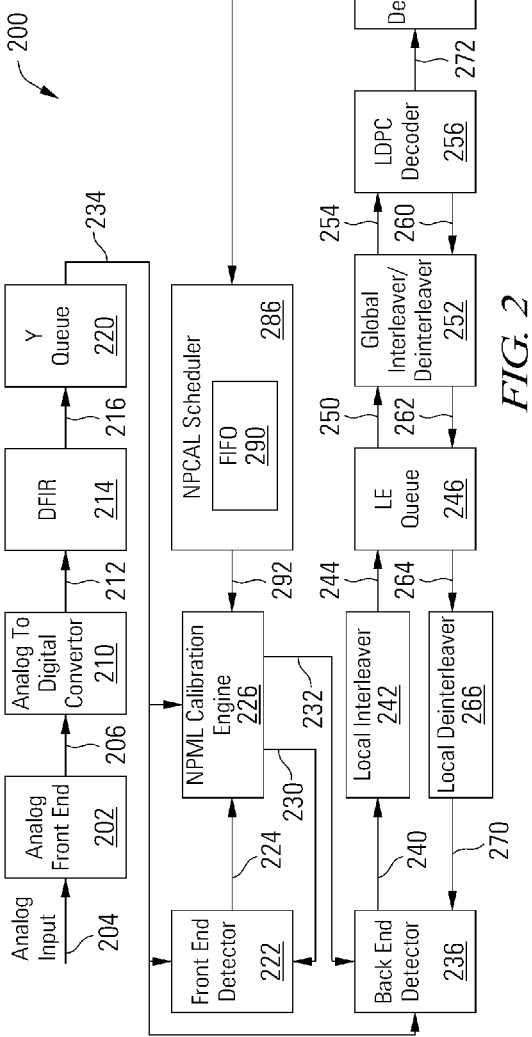
FIG. 2 depicts a block diagram of a read channel with decoder-based filter calibration initialization in accordance with some embodiments of the present inventions.

Turning to FIG. 2, a read channel 200 with decoder-based filter calibration initialization is depicted in accordance with one or more embodiments of the present inventions. Read channel 200 includes an analog front end circuit 202 that receives an analog signal 204. Analog front end circuit 202 processes analog signal 204 and provides a processed analog signal 206 to an analog to digital converter circuit 210. Analog front end circuit 202 may include, but is not limited to, an analog filter and an amplifier circuit as are known in the art. Based upon the disclosure provided herein, one of ordinary skill in the art will recognize a variety of circuitry that may be included as part of analog front end circuit 202. In some cases, analog signal 204 is derived from a read/write head assembly that is disposed in relation to a storage medium. In other cases, analog signal 204 is derived from a receiver circuit that is operable to receive a signal from a transmission medium. The transmission medium may be wired or wireless. Based upon the disclosure provided herein, one of ordinary skill in the art will recognize a variety of sources from which analog input 204 may be derived.

Analog to digital converter circuit 210 converts processed analog signal 206 into a corresponding series of digital samples 212. Analog to digital converter circuit 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present inventions. Digital samples 212 are provided to an equalizer circuit 214. Equalizer circuit 214 applies an equalization algorithm to digital samples 212 to reduce inter-symbol interference (ISI) based on a target response or partial response (PR) target, yielding an equalized output 216. In some embodiments of the present inventions, equalizer circuit 214 is a digital finite impulse response filter circuit as are known in the art. It may be possible that equalized output 216 may be received directly from a storage device in, for example, a solid state storage system. In such cases, analog front end circuit 202, analog to digital converter circuit 210 and equalizer circuit 214 may be eliminated where the data is received as a digital data input. Equalized output 216 is stored in Y queue 220, a memory or buffer operable to store equalized output 216 until a back end data detector 236 is available.

Data detector 236 is operable to apply a data detection algorithm to a received codeword or data set, and in some cases data detector 236 can process two or more codewords in parallel. In some embodiments of the present inventions, data detector 236 is a soft output Viterbi algorithm (SOVA) data detector circuit as is known in the art. The data detector 236 yields an output 240 that may be presented as non-return to zero (nrz) data, and that may include hard decisions along with soft data. The hard decisions are the most likely data values detected in data detector 236 based on Y samples 234 from Y queue 222. As used herein, the phrase "soft data" is used in its broadest sense to mean reliability data with each instance of the reliability data indicating a likelihood that a corresponding bit position or group of bit positions has been correctly detected. In some embodiments of the present inventions, the soft data or reliability data is log likelihood ratio data as is known in the art.

In other embodiments of the present inventions, data detector 236 is a maximum a posteriori data detector circuit as is known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present inventions. Data detector 236 is started based upon availability of Y samples 234 from equalizer circuit 214 via Y queue 222 (new input data sectors) or from a central memory circuit or LE queue 246 (data sectors undergoing a second or later global detection and decoding iteration).

When detection is complete, data detector 236 provides detected output 240. Detected output 240 is provided to a local interleaver circuit 242. Local interleaver circuit 242 is operable to shuffle sub-portions (i.e., local chunks) of the data set included as detected output 240 and provides an interleaved codeword 244 that is stored to central memory circuit or LE queue 246. Interleaver circuit 242 may be any circuit known in the art that is capable of shuffling data sets to yield a rearranged data set. Interleaved codeword 244 is stored to LE queue 246. The interleaved codeword 244 is accessed from LE queue 246 as a stored codeword 250 and globally interleaved by a global interleaver/de-interleaver circuit 252. Global interleaver/de-interleaver circuit 252 may be any circuit known in the art that is capable of globally rearranging codewords. Global interleaver/de-interleaver circuit 252 provides a decoder input 254 to a low density parity check (LDPC) decoder 256. Based upon the disclosure provided herein, one of ordinary skill in the art will recognize other decode algorithms that may be used in relation to different embodiments of the present inventions. The LDPC decoder 256 applies a data decode algorithm to decoder input 254 in a variable number of local iterations.

Where the LDPC decoder 256 fails to converge (i.e., fails to yield the originally written data set) and a number of local iterations through LDPC decoder 256 exceeds a threshold, the resulting decoded output is provided as a decoded output 260 back to LE queue 2460 where it is stored awaiting another global iteration through data detector 236 and LDPC decoder 256. Multiple sectors may be processed simultaneously in the read channel 200, with additional sectors being admitted to the data detector 236 as other sectors converge in the LDPC decoder 256 and are output and cleared from the Y queue 220 and LE queue 246.

Prior to storage of decoded output 260 to LE queue 246, decoded output 260 is globally de-interleaved in global interleaver/de-interleaver circuit 252 to yield a globally de-interleaved output 262 that is stored to LE queue 246. The global de-interleaving reverses the global interleaving earlier applied to stored codeword 250. Once data detector 236 is available, a previously stored de-interleaved output 264 is accessed from LE queue 246 and locally de-interleaved by a de-interleaver circuit 266. De-interleaver circuit 266 re-arranges stored decoder output 264 to reverse the shuffling originally performed by interleaver circuit 242. A resulting de-interleaved output 270 is provided to data detector 236 where it is used to guide subsequent detection of a corresponding data set received as equalized output 216.

Alternatively, where the decoded output converges (i.e., yields the originally written data set) in the LDPC decoder 256, the resulting hard decision or decoded output is provided as an output codeword 272 to a de-interleaver circuit 274. De-interleaver circuit 274 rearranges the data to reverse both the global and local interleaving applied to the data to yield a de-interleaved output 272. De-interleaved hard decision output 276 is stored in hard decision queue (HDQ) 280 and produced at output 282. The hard decisions at output 282 may be received, for example, by a hard disk controller circuit which initiates read operations of a magnetic storage device and which receives the resulting data and provides it to an external device such as a general purpose computer system.

The read channel 200 includes a front end data detector 222 that is operable to apply a data detection algorithm such as a SOVA algorithm to Y samples 234 from Y queue 222, yielding hard decisions and soft data at output 224. Front end detector 222 may be, but is not limited to, a Viterbi or MAP detector having embedded NPFIR filters. Front end detector 222 also may receive stored Y samples at output 234 from Y queue 220. The front end data detector 222 provides data sector hard decisions 224 that may be used by a noise predictive maximum likelihood calibration engine (NPCAL) 226 in a first initialization embodiment, among other uses in the read channel 200.

An NPCAL scheduler 286 receives data sector hard decisions 284 from HDQ 280 and stores them in an internal first-in first-out memory (FIFO) 290, before providing stored hard decisions 292 to NPCAL 226, where they are used to adapt or calibrate tap coefficients. The hard decisions 284 correspond to both converged and unconverged data sectors, that is, to all data sectors processed in the read channel 200 whether they converged on correct values in the LDPC decoder 256 or not. Although the unconverged data sectors are discarded by the NPCAL scheduler 286 during normal operation and are not forwarded to NPCAL 226 for use in calibrating tap coefficients, the unconverged data sectors may be used during the initialization stage.

During normal operation (after the initialization stage), the NPCAL scheduler 286 determines that the hard decisions 284 for a data sector should be provided to the NPCAL 226 when the data sector has converged in LDPC decoder 256, and the hard decisions 284 for the data sector are still available in HDQ 280, and the corresponding Y samples 234 are still available in Y queue 220. The hard decisions 284 for a data sector are available in HDQ 280 in some embodiments until they are transferred out at output 282 to an external device. The Y samples 234 for a data sector are still available in Y queue 220 in some embodiments until a new data sector is received as equalized output 216 for storage in Y queue 220 when no empty buffer slots are available for the new data sector in Y queue 220.

During the initialization stage in some embodiments, the NPCAL scheduler 286 causes the NPCAL 226 to use hard decisions 224 from the data detector 222 along with Y samples 234 from Y queue 222 to calibrate tap coefficients. In other embodiments, the NPCAL scheduler 286 causes the NPCAL 226 to use hard decisions 284 for unconverged data sectors from the LDPC decoder 256 along with Y samples 234 from Y queue 222 to calibrate tap coefficients during the initialization stage. Once data sectors begin to converge, the initialization stage is ended and the NPCAL 226 and NPCAL scheduler 286 transition to normal operation, in which only hard decisions 284 for converged data sectors from the LDPC decoder 256 are used to calibrate tap coefficients. During normal operation, the NPCAL scheduler 286 may either transfer hard decisions 284 for all data sectors from the HDQ 280, whether converged or not, and discard all but the converged data sectors, or may transfer only hard decisions 284 for converged data sectors from the HDQ 280.

The embodiments in which hard decisions 224 from data detector 222 are used to calibrate tap coefficients in NPCAL 226 during the initialization stage may be implemented in some cases with relatively minor changes to existing read channel circuits. However, this embodiment requires dynamic switching between the use of data sectors from data detector 222 and LDPC decoder 256, and the asynchronous timing when data is available for calibration requires that data sectors be carefully tracked in read channel 200 to enable the switching. Furthermore, the embodiments in which hard decisions 284 from LDPC decoder 256 for unconverged data sectors are used to calibrate tap coefficients in NPCAL 226 during the initialization stage may result in better tap coefficients sooner, because the hard decisions 284 from LDPC decoder 256 are more likely to be correct, even if unconverged, than the hard decisions 224 from data detector 222. When using hard decisions 284 from LDPC decoder 256, the hard decisions 224 are available in HDQ 280 after all global iterations have been performed in the read channel 200 for the data sector. Global iterations may be complete if the data sector converges, or after a predetermined number of global iterations have been performed before the data sector converges. (A global iteration refers to the processing of a data sector in the back-end data detector 236 and the LDPC decoder 256, with the results of the LDPC decoder 256 being returned as de-interleaved output 270 to data detector 236 where it is used to guide subsequent detection of a corresponding data set received as equalized output 216.) To use the hard decisions 284 from LDPC decoder 256 to calibrate tap coefficients in NPCAL 226, the corresponding Y samples 234 must also be available from Y queue 220, so that the NPCAL 226 can generate an error signal from the received data in Y samples 234 and the actual data as reported in hard decisions 284.

NPCAL 226 calibrates the tap coefficients in any suitable manner from the 234 and the hard decisions 224 or 284. Tap coefficients 230 and 232 are loaded into front end data detector 222 and back end data detector 236 to perform noise predictive filtering during data detection based on the channel noise.

The determination of when to switch from the initialization stage to normal operation may be based, for example, on the number of data sectors that have converged in the LDPC decoder 256. In some embodiments, the NPCAL 226 and NPCAL scheduler 286 switch to normal operation with decoder-based calibration using only converged data sectors as soon as one data sector converges, in other embodiments, the switch to normal operation takes place after a certain number or a certain percentage of data sectors converge.

Turning to FIG. 3, the operation of command FIFO 290 in NPCAL scheduler 286 is depicted in accordance with some embodiments of the present inventions. Hard decisions for data sectors are received at codeword input 302 and produced at codeword output 304 in the order received. In this example, four codewords (hard decisions for a data sector) are shown in codeword-length slots in the FIFO 290, an unconverged codeword 314 which was received first, an unconverged codeword 312, a converged codeword 310, and an unconverged codeword 306, received in that order. Other codewords may be stored in the FIFO 290 as well, and the length of the FIFO 290 is not limited to any particular number of codewords, although it is given sufficient length to hold more than enough codewords for use in tap coefficient calibration, because some may be discarded by the NPCAL scheduler 286.

During the initialization stage in the embodiments using the hard decisions 284 from the LDPC decoder 256 to calibrate tap coefficients, all data sectors in the HDQ 280 are considered as candidates for calibration and are pushed into the FIFO 290 for further decisions by NPCAL scheduler 286. Priority is given by the NPCAL scheduler 286 to converged data sectors. If there is a converged sector in FIFO 290, the earliest converged sector 310 (with respect to the time it entered the FIFO 290) is selected for calibration, and all earlier unconverged data sectors 312 and 314 are pushed out of the FIFO 290 to allow the earliest converged sector 310 to reach the output 304. If there is no converged sector in the FIFO 290, the unconverged sectors 290, 312 and 314 may be selected by the NPCAL scheduler 286 to pass to the NPCAL 226. The convergence status for each data sector is available from the HDQ 280 and is stored in the FIFO 290 with the data sectors, or is stored in another memory (not shown) and associated with the data sectors in FIFO 290.

In some embodiments, the NPCAL scheduler 286 may also consider the quality of the hard decisions for unconverged data sectors. For example, if no converged data sectors are available, the NPCAL scheduler 286 may consider the log likelihood ratio (LLR) values that indicate the confidence given by the LDPC decoder 256 that the hard decisions are the correct values. In such cases, the NPCAL scheduler 286 may push out and discard one or more unconverged codewords with low confidence values from FIFO 290 to reach and use an unconverged codeword with higher confidence values.

The NPCAL scheduler 286 makes calibration decisions twice. When the LDPC decoder 256 finishes decoding and writing the hard decisions for a data sector to the HDQ 280, the NPCAL scheduler 286 determines whether the data sector is available in the HDQ 280 and whether the corresponding Y samples are available in the Y queue 220. The NPCAL scheduler 286 may also determine whether empty slots are available in HDQ 280 and Y queue 220, preventing the needed data from being flushed from the HDQ 280 and Y queue 220 before it can be used by the NPCAL scheduler 286 and NPCAL 226. Whenever a codeword meets these requirements, the NPCAL scheduler 286 pushes the codeword into the FIFO 290. The oldest codeword in the FIFO 290 (that has not been used for calibration) will be pushed out from the FIFO stack.

The NPCAL scheduler 286 also makes calibration decisions when the NPCAL 226 becomes idle and ready for calibration on a new data sector, the NPCAL scheduler 286 decides which codeword in FIFO 290 to send to the NPCAL 226. If there is no converged codeword in the FIFO 290, the NPCAL scheduler 286 selects the oldest codeword in the FIFO 290 (or the codeword with the highest confidence values), otherwise, it takes the oldest converged codeword. The NPCAL scheduler 286 also checks the data sector availability in the HDQ 280 and Y queue 220.

The NPCAL scheduler 286 and NPCAL 226 operate on whole codewords or data sectors in some embodiments. In other embodiments, tap coefficients may be calibrated using partial data sectors, for example taking only hard decisions with LLR values that meet a confidence threshold.

Figure 4:
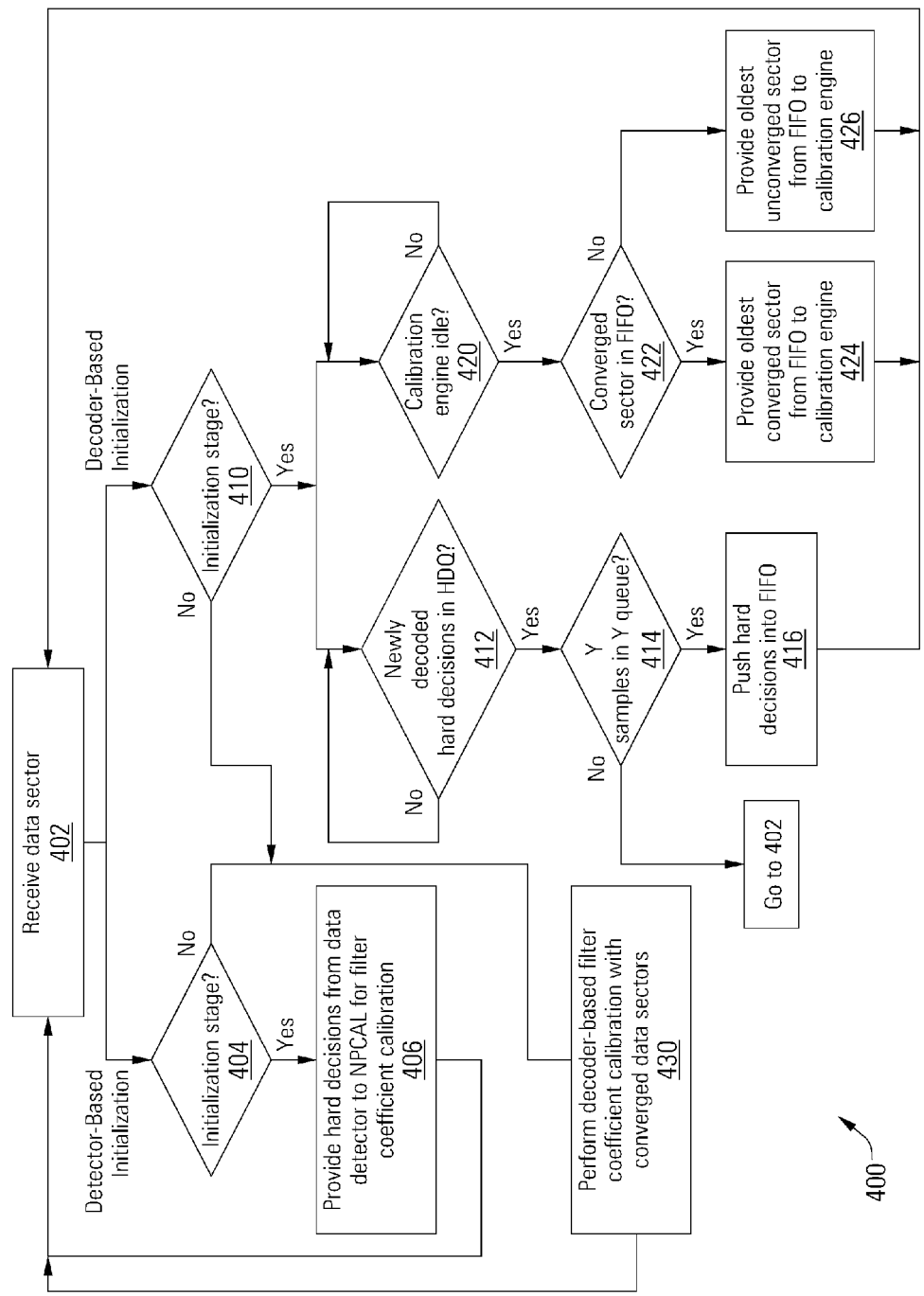
FIG. 4 depicts a flow diagram showing a method for initializing decoder-based filter calibration in accordance with some embodiments of the present inventions.

Turning to FIG. 4, a flow diagram 400 depicts a method for initializing decoder-based filter calibration in accordance with some embodiments of the present inventions. The method of FIG. 4 may be performed, for example by circuits such as those disclosed in FIGS. 2 and 3. Following flow diagram 400, a data sector is received for processing. (Block 402). For embodiments in which hard decisions the data detector are used to calibrate tap coefficients in the NPCAL, the left path from block 402 is taken, for embodiments in which hard decisions from the LDPC decoder for unconverged data sectors are used to calibrate tap coefficients in the NPCAL, the right path from block 402 is taken. Following the left path, a determination is made as to whether the read channel is in the initialization stage. (Block 404) If not, normal decoder-based filter calibration is performed as disclosed above using converged data sectors. (Block 430) If the read channel is in the initialization stage, hard decisions from the data detector are provided to the NPCAL for filter coefficient calibration. (Block 406) Following the right path, a determination is made as to whether the read channel is in the initialization stage. (Block 410) If not, normal decoder-based filter calibration is performed as disclosed above using converged data sectors. (Block 430) If the read channel is in the initialization stage, a determination is made by the NPCAL scheduler as to whether newly decoded hard decisions, whether converged or unconverged, are available in the HDQ. (Block 412) If so, a determination is made as to whether corresponding Y samples are available for the data sector in the Y queue. (Block 414) If so, the hard decisions for the data sector are pushed into the FIFO. (Block 416) The NPCAL scheduler also monitors the calibration engine to determine when it is idle and ready for a new data sector for calibration of filter coefficients. (Block 420) If so, the NPCAL scheduler determines whether the FIFO contains a converged sector. (Block 422) If so, the NPCAL scheduler provides the oldest converged sector from FIFO to calibration engine. (Block 424) If not, the NPCAL scheduler provides the oldest unconverged sector from FIFO to calibration engine. (Block 426) In some embodiments, the NPCAL scheduler provides the unconverged sector with the highest confidence values.

Figure 5:
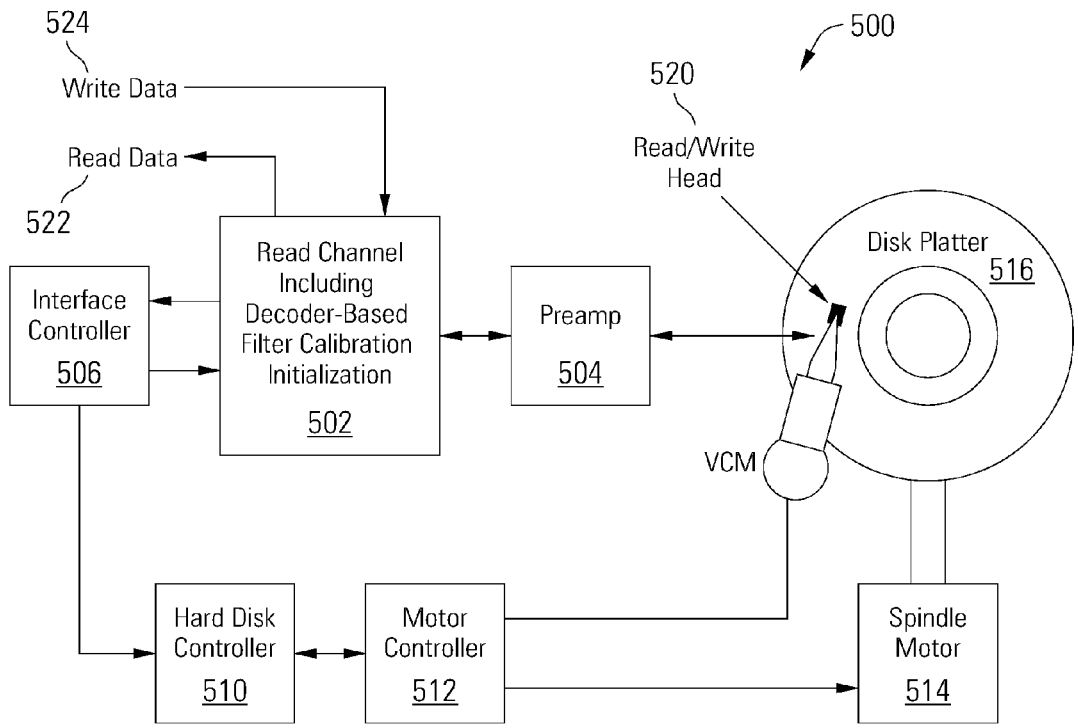
FIG. 5 depicts a storage system using decoder-based filter calibration initialization in accordance with various embodiments of the present invention.
Figure 6:
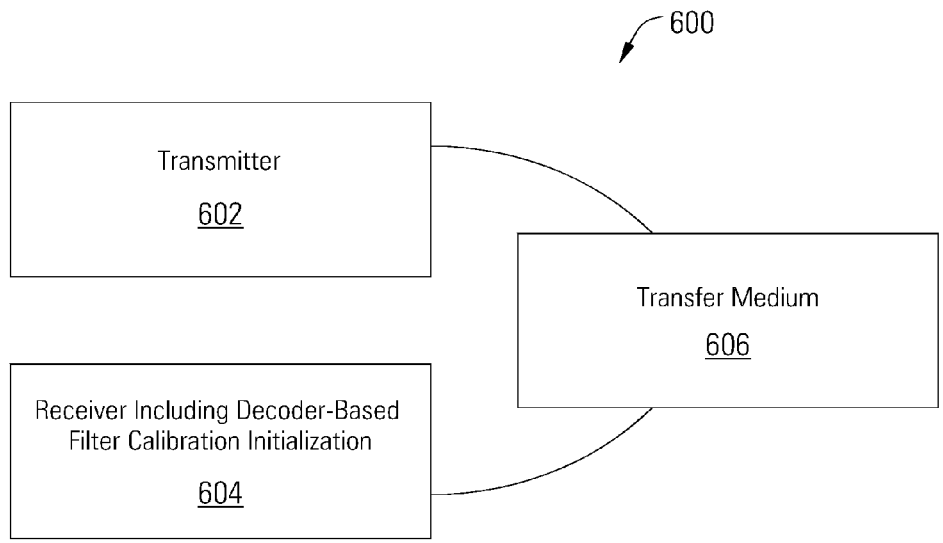
FIG. 6 depicts a wireless communication system using decoder-based filter calibration initialization in accordance with various embodiments of the present invention.

Although the decoder-based filter calibration initialization disclosed herein is not limited to any particular application, several examples of applications are presented in FIGS. 5 and 6 that benefit from embodiments of the present invention. Turning to FIG. 5, a storage system 500 is illustrated as an example application of decoder-based filter calibration initialization in accordance with some embodiments of the present invention. The storage system 500 includes a read channel circuit 502 with decoder-based filter calibration initialization in accordance with some embodiments of the present inventions. Storage system 500 may be, for example, a hard disk drive. Storage system 500 also includes a preamplifier 504, an interface controller 506, a hard disk controller 510, a motor controller 512, a spindle motor 514, a disk platter 516, and a read/write head assembly 520. Interface controller 506 controls addressing and timing of data to/from disk platter 516. The data on disk platter 516 consists of groups of magnetic signals that may be detected by read/write head assembly 520 when the assembly is properly positioned over disk platter 516. In one embodiment, disk platter 516 includes magnetic signals recorded in accordance with either a longitudinal or a perpendicular recording scheme.

In a typical read operation, read/write head assembly 520 is accurately positioned by motor controller 512 over a desired data track on disk platter 516. Motor controller 512 both positions read/write head assembly 520 in relation to disk platter 516 and drives spindle motor 514 by moving read/write head assembly 520 to the proper data track on disk platter 516 under the direction of hard disk controller 510. Spindle motor 514 spins disk platter 516 at a determined spin rate (RPMs). Once read/write head assembly 520 is positioned adjacent the proper data track, magnetic signals representing data on disk platter 516 are sensed by read/write head assembly 520 as disk platter 516 is rotated by spindle motor 514. The sensed magnetic signals are provided as a continuous, minute analog signal representative of the magnetic data on disk platter 516. This minute analog signal is transferred from read/write head assembly 520 to read channel circuit 502 via preamplifier 504. Preamplifier 504 is operable to amplify the minute analog signals accessed from disk platter 516. In turn, read channel circuit 502 decodes and digitizes the received analog signal to recreate the information originally written to disk platter 516. This data is provided as read data 522 to a receiving circuit. As part of decoding the received information, read channel circuit 502 processes the received signal using detectors with embedded NPFIRs, calibrated by decoder-based NPCAL with calibration initialization disclosed herein. Such decoder-based filter calibration initialization may be implemented consistent with that disclosed above in relation to FIGS. 2 and 3. In some cases, the decoder-based filter calibration initialization may be performed consistent with the flow diagram disclosed above in relation to FIG. 4. A write operation is substantially the opposite of the preceding read operation with write data 524 being provided to read channel circuit 502. This data is then encoded and written to disk platter 516.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 6, a wireless communication system 600 or data transmission device including a receiver 604 with decoder-based filter calibration initialization is shown in accordance with some embodiments of the present inventions. Communication system 600 includes a transmitter 602 that is operable to transmit encoded information via a transfer medium 606 as is known in the art. The encoded data is received from transfer medium 606 by receiver 604. Receiver 604 uses a detector with embedded NPFIRs, using decoder-based filter calibration initialization disclosed herein. Such decoder-based filter calibration initialization may be implemented consistent with that disclosed above in relation to FIGS. 2 and 3. In some cases, the decoder-based filter calibration initialization may be performed consistent with the flow diagram disclosed above in relation to FIG. 4.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for decoder-based filter calibration initialization. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for calibrating a noise predictive filter, comprising:
    a data detector operable to generate detected values for data sectors, wherein the data detector has an embedded noise predictive finite impulse response filter;
    a data decoder operable to generate decoded values based on the detected values and to provide an indication of whether the decoded values converged in the data decoder;
    a noise predictive calibration engine operable to calibrate filter coefficients for the noise predictive finite impulse response filter based on the decoded values that converged in the data decoder; and
    a scheduler operable to provide unconverged data sectors to the noise predictive calibration engine to calibrate the filter coefficients during an initialization mode before any of the data sectors converge in the data decoder.

2. The apparatus of claim 1, wherein the unconverged data sectors comprise hard decisions from the data detector.

3. The apparatus of claim 1, wherein the unconverged data sectors comprise hard decisions for unconverged data sectors from the data decoder.

4. The apparatus of claim 3, wherein the scheduler includes a first-in first-out memory operable to store hard decisions for the data sectors.

5. The apparatus of claim 4, wherein the scheduler is operable to push the hard decisions for one of the data sectors into the first-in first-out memory when the hard decisions are available and when corresponding input data is available.

6. The apparatus of claim 5, wherein the hard decisions are available when stored in a hard decision queue and the corresponding input data is available when Y samples for said one of the data sectors is stored in a Y sample queue.

7. The apparatus of claim 4, wherein the scheduler is operable to provide the hard decisions for one of the data sectors from the first-in first-out memory to the noise predictive calibration engine when the noise predictive calibration engine is idle and ready to calibrate the filter coefficients based on a new one of the data sectors.

8. The apparatus of claim 7, wherein the scheduler is operable to determine whether the first-in first-out memory contains the hard decisions for any of the data sectors that converged in the data decoder.

9. The apparatus of claim 8, wherein the scheduler is operable to provide the hard decisions for an oldest converged one of the data sectors in the first-in first-out memory to the noise predictive calibration engine when the first-in first-out memory contains the hard decisions for any of the data sectors that converged in the data decoder.

10. The apparatus of claim 8, wherein the scheduler is operable to provide the hard decisions for an oldest unconverged one of the data sectors in the first-in first-out memory to the noise predictive calibration engine when the first-in first-out memory does not contain the hard decisions for any of the data sectors that converged in the data decoder.

11. The apparatus of claim 1, wherein the data detector, data decoder, noise predictive calibration engine and scheduler are implemented as an integrated circuit.

12. The apparatus of claim 1, wherein the data detector, data decoder, noise predictive calibration engine and scheduler are incorporated in a storage device.

13. The apparatus of claim 1, wherein the data detector, data decoder, noise predictive calibration engine and scheduler are incorporated in a storage system comprising a redundant array of independent disks.

14. The apparatus of claim 1, wherein the data detector, data decoder, noise predictive calibration engine and scheduler are incorporated in a transmission system.

15. A method for initializing decoder-based filter calibration, comprising:
    detecting values for data sectors in a data detector, wherein the data detector has an embedded noise predictive finite impulse response filter;
    generating decoded values and convergence status based on the detected values in a data decoder;
    calibrating filter coefficients during an initialization mode for the noise predictive finite impulse response filter in a noise predictive calibration engine based on the data sectors that have not converged in the data decoder; and
    calibrating filter coefficients in a post-initialization mode for the noise predictive finite impulse response filter in the noise predictive calibration engine based on the decoded values that converged in the data decoder.

16. The method of claim 15, wherein the data sectors that have not converged in the data decoder are obtained from an output of the data detector.

17. The method of claim 15, further comprising detecting that one of the data sectors has been decoded in the data decoder and that corresponding Y samples are available in a Y queue, and pushing hard decisions for said one of the data sectors into a scheduler first-in first-out memory.

18. The method of claim 15, further comprising detecting that the noise predictive calibration engine is ready to calibrate the filter coefficients based on a new data sector and transferring hard decisions for one of the data sectors from a scheduler first-in first-out memory to the noise predictive calibration engine.

19. The method of claim 18, wherein transferring the hard decisions for said one of the data sectors from the scheduler first-in first-out memory to the noise predictive calibration engine comprises transferring an oldest converged data sector if the scheduler first-in first-out memory contains a converged data sector and transferring an oldest unconverged data sector if the scheduler first-in first-out memory does not contain a converged data sector.

20. A storage system comprising:
    a storage medium maintaining a data set;
    a read/write head assembly operable to sense the data set on the storage medium and to provide an analog output corresponding to the data set;
    an analog to digital converter operable to sample a continuous signal to yield a digital output;
    a data detector operable to generate detected values for data sectors in the digital output, wherein the data detector has an embedded noise predictive finite impulse response filter;
    a data decoder operable to generate decoded values based on the detected values and to provide an indication of whether the decoded values converged in the data decoder;
    a noise predictive calibration engine operable to calibrate filter coefficients for the noise predictive finite impulse response filter based on the decoded values that converged in the data decoder; and
    a scheduler operable to provide unconverged data sectors to the noise predictive calibration engine to calibrate the filter coefficients during an initialization mode before any of the data sectors converge in the data decoder.

21. The storage system of claim 20, wherein the storage medium comprises a redundant array of independent disks.

* * * * *